United States Patent
Chen et al.

(10) Patent No.: US 9,520,385 B1
(45) Date of Patent: Dec. 13, 2016

(54) PACKAGE STRUCTURE AND METHOD FOR FORMING SAME

(71) Applicant: Taiwan Semiconductor Manufacturing Company, Ltd., Hsin-Chu (TW)

(72) Inventors: Hsien-Wei Chen, Hsin-Chu (TW); Kuo-Chuan Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/754,070

(22) Filed: Jun. 29, 2015

(51) Int. Cl.
*H01L 25/10* (2006.01)
*H01L 25/00* (2006.01)
*H01L 23/31* (2006.01)
*H01L 21/56* (2006.01)
*H01L 23/538* (2006.01)

(52) U.S. Cl.
CPC .......... *H01L 25/105* (2013.01); *H01L 21/565* (2013.01); *H01L 23/3114* (2013.01); *H01L 23/5384* (2013.01); *H01L 25/50* (2013.01); *H01L 2225/1058* (2013.01); *H01L 2225/1088* (2013.01)

(58) Field of Classification Search
None
See application file for complete search history.

(56) References Cited

U.S. PATENT DOCUMENTS

| | | | |
|---|---|---|---|
| 7,564,115 B2 | 7/2009 | Chen et al. | |
| 7,633,165 B2 | 12/2009 | Hsu et al. | |
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,138,014 B2 * | 3/2012 | Chi | H01L 24/97 257/E21.499 |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,426,961 B2 | 4/2013 | Shih et al. | |
| 8,597,983 B2 * | 12/2013 | Gong | H01L 23/49811 257/676 |
| 8,669,174 B2 | 3/2014 | Wu et al. | |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,810,024 B2 * | 8/2014 | Lin | H01L 23/13 257/621 |
| 8,975,726 B2 * | 3/2015 | Chen | H01L 24/83 257/532 |
| 9,406,658 B2 * | 8/2016 | Lee | H01L 25/16 |

(Continued)

*Primary Examiner* — Andres Munoz
(74) *Attorney, Agent, or Firm* — Slater Matsil, LLP

(57) ABSTRACT

A device comprises a bottom package comprising an interconnect structure, a molding compound layer over the interconnect structure, a semiconductor die in the molding compound layer and a solder layer embedded in the molding compound layer, wherein a top surface of the solder layer is lower than a top surface of the molding compound layer and a top package bonded on the bottom package through a joint structure formed by the solder layer and a bump of the top package.

20 Claims, 15 Drawing Sheets

(56) References Cited

U.S. PATENT DOCUMENTS

| | | | |
|---|---|---|---|
| 2010/0059854 A1* | 3/2010 | Lin | H01L 25/16 257/528 |
| 2012/0199972 A1* | 8/2012 | Pagaila | H01L 21/6835 257/737 |
| 2013/0062761 A1* | 3/2013 | Lin | H01L 23/49816 257/738 |
| 2013/0093078 A1* | 4/2013 | Lin | H01L 21/568 257/737 |
| 2013/0182402 A1* | 7/2013 | Chen | H01L 23/49827 361/807 |
| 2014/0001645 A1 | 1/2014 | Lin et al. | |
| 2014/0110856 A1* | 4/2014 | Lin | H01L 24/19 257/774 |
| 2014/0225258 A1 | 8/2014 | Chiu et al. | |
| 2014/0252572 A1 | 9/2014 | Hou et al. | |
| 2015/0098204 A1* | 4/2015 | Yoshikawa | H05K 1/144 361/767 |
| 2015/0262909 A1* | 9/2015 | Chen | H01L 24/20 257/774 |
| 2015/0348916 A1* | 12/2015 | Chen | H01L 21/4803 257/669 |
| 2016/0020172 A1* | 1/2016 | Su | H01L 23/49822 257/530 |
| 2016/0163566 A1* | 6/2016 | Chen | H01L 21/4846 257/774 |

* cited by examiner

PACKAGE STRUCTURE AND METHOD FOR FORMING SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for miniaturization, higher speed and greater bandwidth, as well as lower power consumption and latency has grown recently, there has grown a need for smaller and more creative packaging techniques of semiconductor dies.

As semiconductor technologies further advance, package-on-package semiconductor devices have emerged as an effective alternative to further reduce the physical size of a semiconductor device. In a package on package semiconductor device, active circuits such as logic, memory, processor circuits and the like are fabricated on different wafers and packages. Two or more packages are installed on top of one another, i.e. stacked, with a standard interface to route signals between them. Much higher density can be achieved by employing package on package semiconductor devices. Furthermore, package on package semiconductor devices can achieve smaller form factors, cost-effectiveness, increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
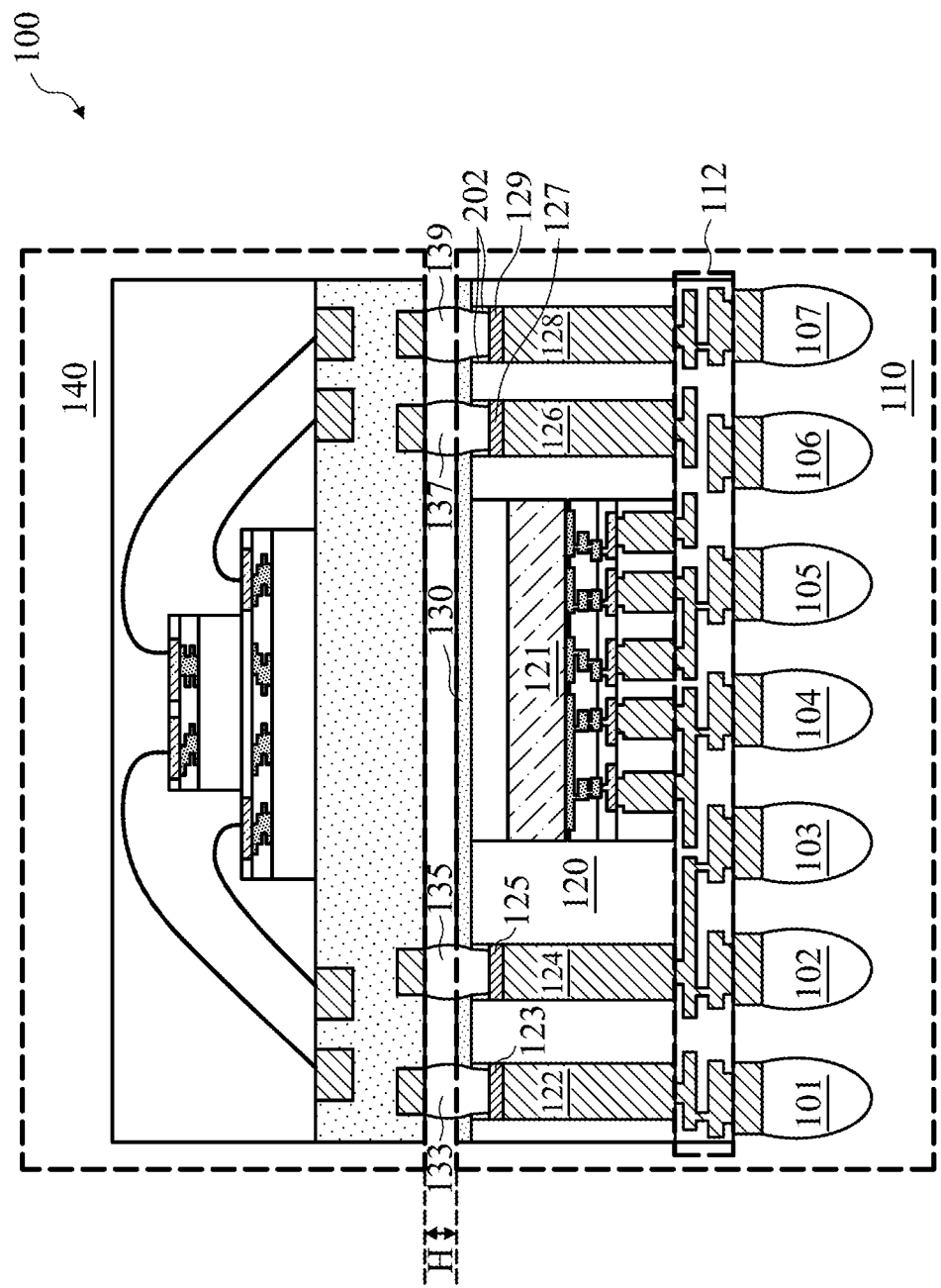
FIG. 1 illustrates a cross sectional view of a package-on-package semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross sectional view of a package-on-package semiconductor device in accordance with various embodiments of the present disclosure. The package-on-package semiconductor device 100 may include a bottom package 110 and a top package 140. In particular, the top package 140 is stacked on top of the bottom package 110. In addition, the top package 140 and the bottom package 110 are bonded together through a joint structure formed by top package bumps 133, 135, 137 and 139, and their respective solder layers 123, 125, 127 and 129 embedded in the a molding compound layer 120 of the bottom package 110. As shown in FIG. 1, the joint structure includes four solder covered bumps, which are generated by a reflow process. The reflow process will be described below with respect to FIG. 12.

In some embodiments, top package bumps 133, 135, 137 and 139 are formed of suitable conductive materials such as copper and the like. The solder layers 123, 125, 127 and 129 comprise tin (Sn) and/or other suitable metallic elements. The solder layers have a height in a range from 30 um to 50 um. There is a gap between the bottom surface of the top package 140 and the top surface of the bottom package 110. The height of the gap is defined as H as shown in FIG. 1. In some embodiments, H is equal to 30 um.

One advantageous feature of having the solder layers 123, 125, 127 and 129 is the solder layers embedded in the molding compound layer 120 can help to reduce the total height of the package-on-package semiconductor device 100 through reducing the gap between the bottom surface of the top package 140 and the top surface of the bottom package 110.

The bottom package 110 comprises a dielectric layer 130, the molding compound layer 120 and an interconnect structure 112. As shown in FIG. 1, the molding compound layer 120 is between the dielectric layer 130 and the interconnect structure 112. Furthermore, a semiconductor die 121 is embedded in the molding compound layer 120. As shown in FIG. 1, a substrate side of the semiconductor die 121 is bonded on the dielectric layer 130. An interconnect side of the semiconductor die 121 is in direct contact with the interconnect structure 112.

A plurality of through vias 122, 124, 126 and 128 are embedded in the molding compound layer 120. As shown in FIG. 1, a bottom surface of each through via (e.g., through via 122) is connected to the interconnect structure 112. A top surface of each through via (e.g., through via 122) is in direct contact with a bottom surface of a corresponding solder layer (e.g., solder layer 123). The through vias 122, 124, 126 and 128 are formed of suitable conductive materials such as copper and/or the like.

A plurality of bottom package bumps 101, 102, 103, 104, 105, 106 and 107 are formed on the interconnect structure 112 of the bottom package 110. In some embodiments, the bottom package bumps 101, 102, 103, 104, 105, 106 and 107 are solder balls. There may be a plurality of under bump metallization (UBM) structures formed underneath their respective bottom package bumps. The detailed formation processes of the bottom package bumps 101, 102, 103, 104, 105, 106 and 107 and the UBM structures will be described below with respect to FIG. 10.

It should be noted that the numbers of bottom package bumps (e.g., bumps 135-139), top package bumps (e.g., bumps 101-107), through vias (e.g., through vias 122-128) and solder layers (e.g., solder layers 123-129) shown in FIG. 1 are merely examples. A person skilled in the art would recognize many variations, alternatives, and modifications. For example, the bottom package 110 could accommodate any number of through vias.

FIGS. 2-12 illustrate intermediate steps of fabricating the package-on-package semiconductor device shown in FIG. 1 in accordance with various embodiments of the present disclosure. It should be noted that the fabrication steps as well as the package-on-package structure shown in FIGS. 2-12 are merely an example. A person skilled in the art will recognize there may be many alternatives, variations and modifications.

Figure 2:
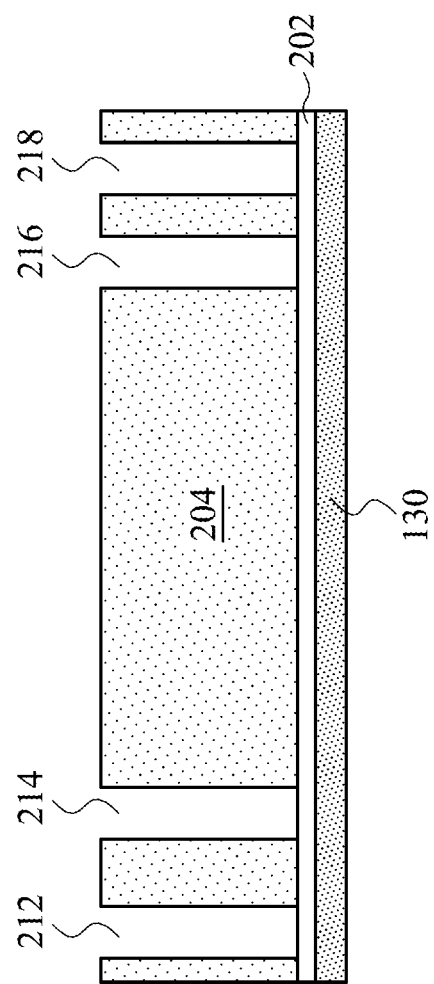
FIG. 2 illustrates a cross sectional view of a portion of the bottom package in accordance with various embodiments of the present disclosure.

FIG. 2 illustrates a cross sectional view of a portion of the bottom package in accordance with various embodiments of the present disclosure. The dielectric layer 130 may be made of polymer materials such as epoxy, polyimide, polybenzoxazole (PBO), silicone, benzocyclobutene (BCB), molding compounds and/or the like. In accordance with an embodiment, the dielectric layer 130 may be formed of PBO. The dielectric layer 130 may be made by suitable deposition methods known in the art such as spin coating.

A seed layer 202 is formed one the dielectric layer 130. The seed layer 202 may be formed of copper, nickel, gold, any combination thereof and/or the like. The seed layer 202 may be formed by suitable deposition techniques such as physical vapor deposition (PVD), chemical vapor deposition (CVD) and/or the like. The seed layer 202 may have a thickness of between about 500 Angstroms and about 5,000 Angstroms.

A photoresist layer 204 is formed over the seed layer 202. In accordance with an embodiment, the photoresist layer 204 may be formed of suitable photoresist materials such as SU-8 photo-sensitive epoxy, film type polymer materials and/or the like. The photoresist layer 204 may be formed by suitable semiconductor fabrication techniques such as spin coating and/or the like.

Once the photoresist layer 204 is formed, a patterning process is applied to the photoresist layer 204. In consideration of the location of through vias 122, 124, 126 and 128, and solder layers 123, 125, 127 and 129 shown in FIG. 1, selective areas of the photoresist layer 204 are exposed to light. As a result, a variety of openings 212, 214, 216 and 218 are formed on top of the seed layer. The formation of the openings such as opening 212 in the photoresist layer 204 involves lithography operations, which are well known, and hence are not discussed in further detail herein to avoid unnecessary repetition.

Figure 3:
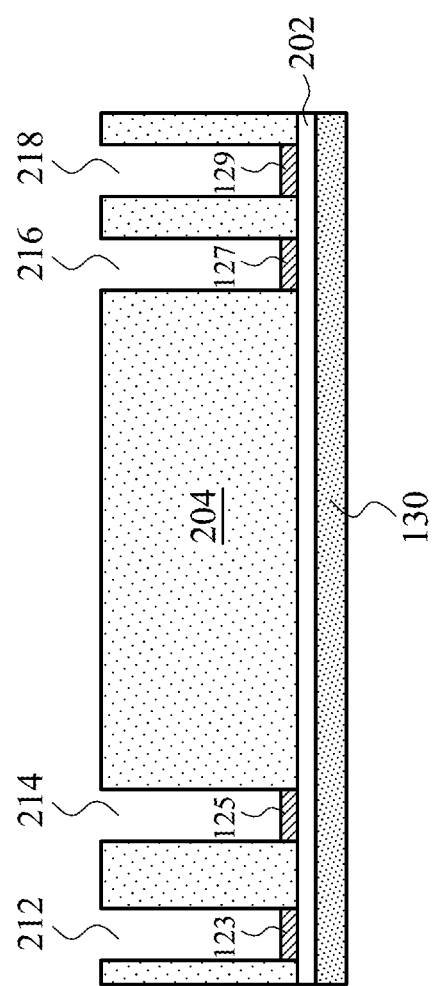
FIG. 3 illustrates a cross sectional view of the semiconductor device shown in FIG. 2 after solder layers are formed in the bottoms of the openings in accordance with various embodiments of the present disclosure.

FIG. 3 illustrates a cross sectional view of the semiconductor device shown in FIG. 2 after solder layers are formed in the bottoms of the openings in accordance with various embodiments of the present disclosure. A plating process is employed to form solder layers 123, 125, 127 and 127 in the bottoms of their respective openings.

The current density and the plating time are controlled such that the thickness of the solder layers 123, 125, 127 and 127 is in a range from 30 um to 50 um. In some embodiments, the solder layers 123, 125, 127 and 127 comprise tin (Sn). The plating time is in a range from about 10 minutes to about 15 minutes.

Figure 4:
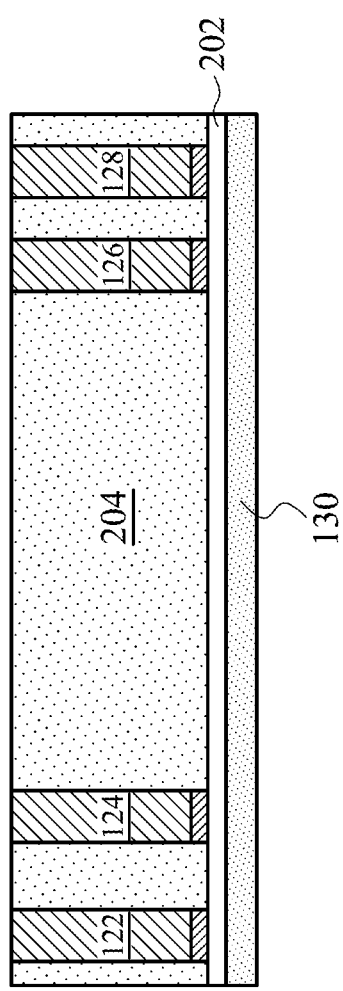
FIG. 4 illustrates a cross sectional view of the semiconductor device shown in FIG. 3 after a conductive material is filled in the openings in accordance with various embodiments of the present disclosure.

FIG. 4 illustrates a cross sectional view of the semiconductor device shown in FIG. 3 after a conductive material is filled in the openings in accordance with various embodiments of the present disclosure. The openings (e.g., opening 212 shown in FIG. 3) on top of the solder layers (e.g., solder layer 123 shown in FIG. 3) may be filled with a conductive material. The conductive material may comprise copper, although other suitable materials such as aluminum, alloys, tungsten, silver, doped polysilicon, combinations thereof, and/or the like, may alternatively be utilized.

As shown in FIG. 4, the openings 212, 214, 216 and 218 shown in FIG. 3 are filled with the conductive material. Once the plating process finishes, a planarization process such as a chemical mechanical polish (CMP) process may be performed to remove excess portions of the conductive material. More particularly, the CMP process is applied to the conductive material over the photoresist layer 204 until the top surface of the photoresist layer 204 is exposed.

Figure 5:
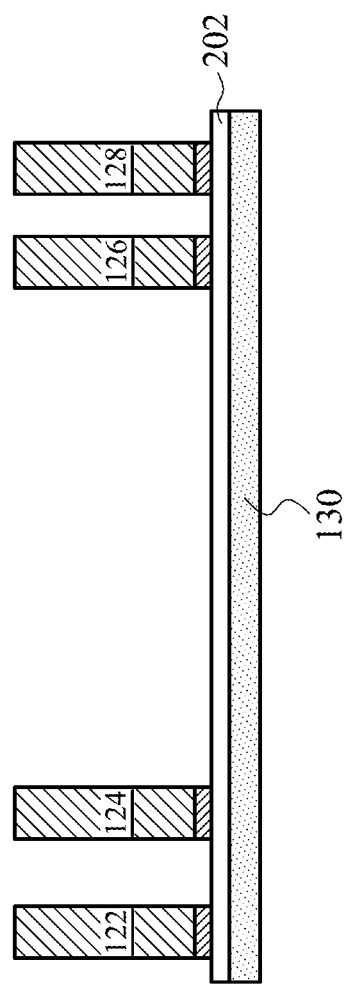
FIG. 5 illustrates a cross sectional view of the semiconductor device shown in FIG. 4 after the remaining photoresist layer has been removed in accordance with various embodiments of the present disclosure.

FIG. 5 illustrates a cross sectional view of the semiconductor device shown in FIG. 4 after the remaining photoresist layer has been removed in accordance with various embodiments of the present disclosure. In some embodiments, the remaining photoresist layer 204 shown in FIG. 4 may be removed by using suitable photoresist stripping techniques such as chemical solvent cleaning, plasma ashing, dry stripping and/or the like. The photoresist stripping techniques are well known and hence are not discussed in further detail herein to avoid unnecessary repetition.

Figure 6:
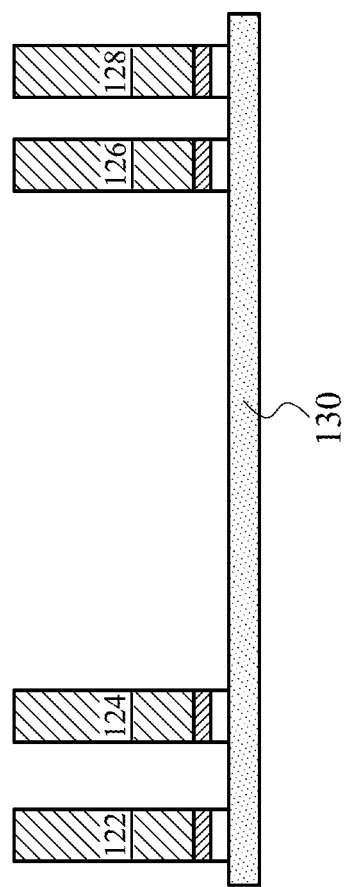
FIG. 6 illustrates a cross sectional view of the semiconductor device shown in FIG. 5 after the exposed portion of the seed layer has been removed in accordance with various embodiments of the present disclosure.

FIG. 6 illustrates a cross sectional view of the semiconductor device shown in FIG. 5 after the exposed portion of the seed layer has been removed in accordance with various embodiments of the present disclosure. The exposed portion of the seed layer 202 shown in FIG. 5 may be removed by using a suitable etching process such as wet-etching, dry-etching and/or the like. The detailed operations of either the dry etching process or the wet etching process are well known in the art, and hence are not discussed herein to avoid unnecessary repetition.

Figure 7:
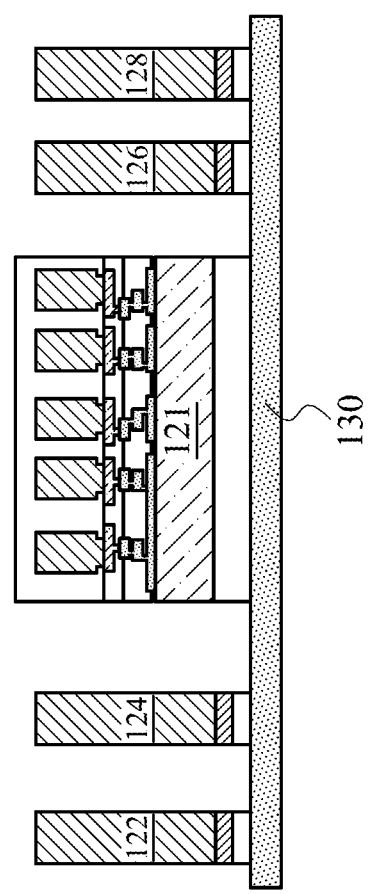
FIG. 7 illustrates a cross sectional view of the semiconductor device shown in FIG. 6 after a semiconductor die is mounted on the dielectric layer in accordance with various embodiments of the present disclosure.

FIG. 7 illustrates a cross sectional view of the semiconductor device shown in FIG. 6 after a semiconductor die is mounted on the dielectric layer in accordance with various embodiments of the present disclosure. The semiconductor die 121 comprises a substrate and a plurality of interconnect structures formed over the substrate. The semiconductor die 121 is picked and placed on the dielectric layer 130 as shown in FIG. 7. In particular, the substrate side of the semiconductor die 121 is in direct contact with the top surface of the dielectric layer 130. In alternative embodiments, the substrate side of the semiconductor die 121 is bonded on the dielectric layer 130 through an adhesive layer (not shown).

It should be noted that while FIG. 7 illustrates one semiconductor die bonded on the dielectric layer 130, the dielectric layer 130 may accommodate any number of semiconductor dies. It should further be noted that FIG. 7 illustrates the top surface of the semiconductor die 121 is higher than the top surfaces of the through vias 122, 124, 126 and 128. The height of the through vias 122, 124, 126 and 128 illustrated in FIG. 7 is merely an example, which should not unduly limit the scope of the claims. One of ordinary skill in the art would recognize many variations, alternatives, and modifications. For example, the top surfaces of the through vias 122, 124, 126 and 128 may be level with the top surface of the semiconductor die 121.

Figure 8:
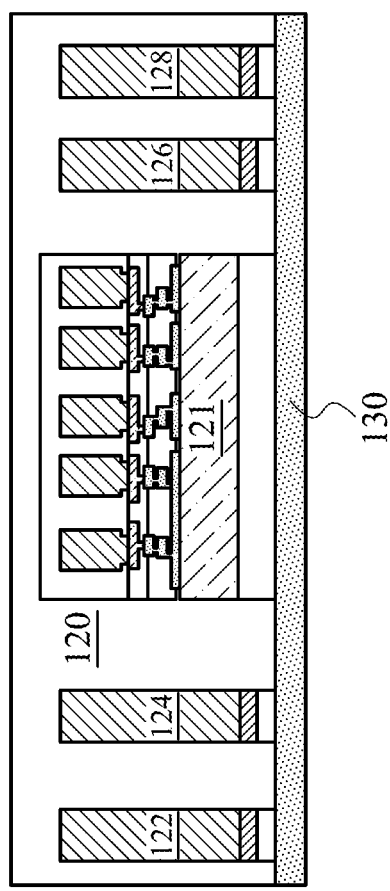
FIG. 8 illustrates a cross sectional view of the semiconductor device shown in FIG. 7 after a molding compound layer is formed over the semiconductor device in accordance with various embodiments of the present disclosure.

FIG. 8 illustrates a cross sectional view of the semiconductor device shown in FIG. 7 after a molding compound layer is formed over the semiconductor device in accordance with various embodiments of the present disclosure. The molding compound layer 120 may fill the gaps between the semiconductor die 121 and the adjacent through vias (e.g., through vias 124 and 126) as well as the gap between two adjacent through vias (e.g., through vias 122 and 124). As shown in FIG. 8, the through vias 122, 124, 126 and 128, and the semiconductor die 121 are embedded in the molding compound layer 120.

In some embodiments, the molding compound layer 120 may be an epoxy, which is dispensed at the gaps described above. The epoxy may be applied in a liquid form, and may harden after a curing process. In alternative embodiments, the molding compound layer 120 may be formed of curable materials such as polymer based materials, resin based materials, polyimide, epoxy and any combinations of thereof. The molding compound layer 120 can be formed by any suitable dispense techniques.

Figure 9:
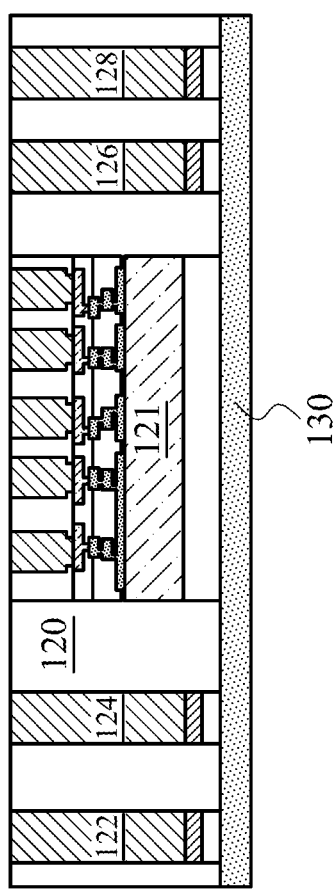
FIG. 9 illustrates a cross sectional view of the semiconductor device shown in FIG. 8 after a grinding process is applied to the top surface of the molding compound layer in accordance with various embodiments of the present disclosure.

FIG. 9 illustrates a cross sectional view of the semiconductor device shown in FIG. 8 after a grinding process is applied to the top surface of the molding compound layer in accordance with various embodiments of the present disclosure. The top surface of the molding compound layer 120 undergoes a grinding process. The grinding process can employ a mechanical grinding process, a chemical polishing process, an etching process, any combinations thereof and/or the like.

As shown in FIG. 9, the grinding process is applied to the top surface of the molding compound layer 120 until the top surfaces of the through vias 122, 124, 126 and 128 become exposed. In particular, as shown in FIG. 9, the top surface of the interconnect side of the semiconductor die 121 and the top surfaces of the through vias 122, 124, 126 and 128 may be exposed outside the molding compound layer 120. As a result of performing the grinding process, the top surfaces of the through vias 122, 124, 126 and 128 are level with the top surface of the interconnect side of the semiconductor die 121.

Figure 10:
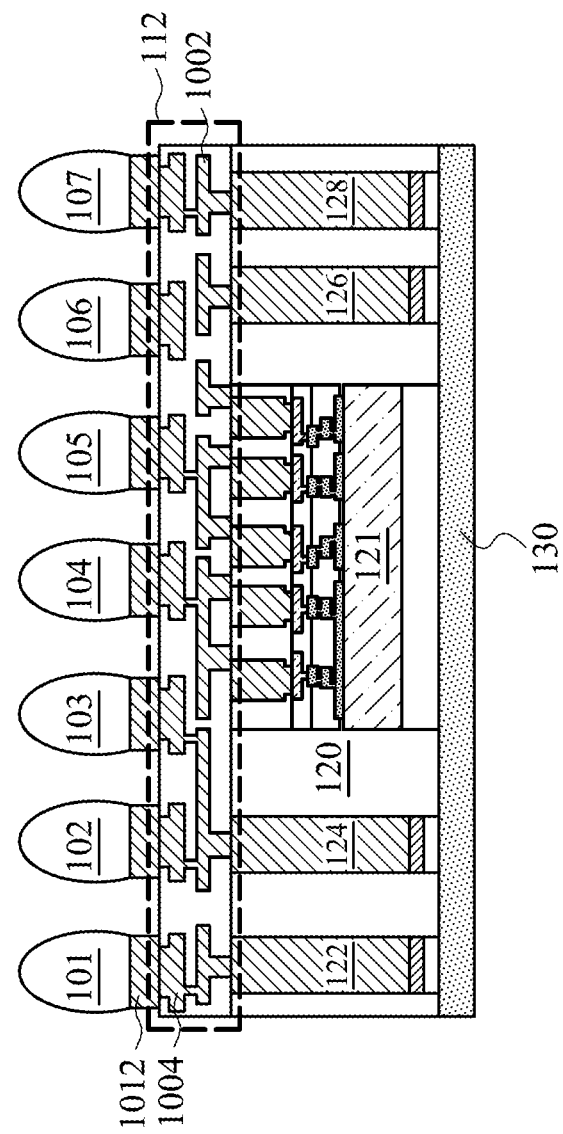
FIG. 10 illustrates a cross sectional view of the semiconductor device shown in FIG. 9 after a plurality of interconnect structures are formed over the molding compound layer in accordance with various embodiments of the present disclosure.

FIG. 10 illustrates a cross sectional view of the semiconductor device shown in FIG. 9 after a plurality of interconnect structures are formed over the molding compound layer in accordance with various embodiments of the present disclosure. As shown in FIG. 10, the interconnect structure 112 is formed over the molding compound layer 120.

The interconnect structure 112 may include an inter-layer dielectric (ILD) layer, an inter-metal dielectric layer (IMD) layer, a metal line and a redistribution layer. The interconnect structure 112 is electrically coupled to the interconnect structure of the semiconductor die 121 and the through vias 122, 124, 126 and 128.

This interconnect structure 112 shown in FIG. 10 is merely an example, which should not unduly limit the scope of the claims. One of ordinary skill in the art would recognize many variations, alternatives, and modifications. For example, the interconnect structure 112 may comprise a plurality of IMD layers.

The ILD layer may be formed, for example, of a low-K dielectric material, such as silicon oxide, phosphosilicate glass (PSG), borophosphosilicate glass (BPSG), fluorinated silicate glass (FSG), $SiO_x C_y$, Spin-On-Glass, Spin-On-Polymers, silicon carbon material, compounds thereof, composites thereof, combinations thereof or the like, by any suitable method known in the art, such as spinning, CVD, and plasma enhanced CVD (PECVD).

One or more IMD layers and the associated metallization layers (not shown) are formed over the ILD layer. Generally, the one or more IMD layers and the associated metal lines are used to interconnect the electrical circuitry to each other and to provide an external electrical connection. The IMD layers are preferably formed of a low-K dielectric material, such as FSG formed by PECVD techniques or high-density plasma chemical vapor deposition (HDPCVD) or the like It should be noted the interconnect structure may comprise a plurality of metal lines 1002 as shown in FIG. 10. The metal lines 1002 are used to interconnect the integrated circuit devices. The metal lines 1002 may be formed in different layers and separated by the ILD layers and the IMD layers.

One skilled in the art will recognize that the interconnect structure may comprise more inter-metal dielectric layers and the associated metal lines and plugs. In particular, the layers between the metallization layers may be formed by alternating layers of dielectric (e.g., extremely low-k dielectric material) and conductive materials (e.g., copper).

The metal lines 1002 may be formed of metal materials such as copper, copper alloys, aluminum, silver, gold, any combinations thereof and/or the like. The metal lines 1002 may be formed by a dual damascene process, although other suitable techniques such as deposition, single damascene may alternatively be used. The dual damascene process is well known in the art, and hence is not discussed herein The redistribution layer 1004 may be a single material layer, or a multi-layered structure and may be made of metals such as titanium, titanium nitride, aluminum, tantalum, copper and combinations thereof. The redistribution layer 1004 may be made by any suitable method known in the art such as PVD, sputter, CVD, electroplating and/or the like.

Once the interconnect structure 112 is formed, a plurality of UBM structures and their respective bumps are formed over the interconnect structure 112 as shown in FIG. 10. The plurality of UBM structures 1012 are formed over the redistribution layer 1004. The UBM structures 1012 help to prevent diffusion between the solder balls and the integrated circuits of the semiconductor device, while providing a low resistance electrical connection.

In some embodiments, the bumps 101, 102, 103, 104, 105, 106 and 107 are solder balls. In some embodiments, the solder balls may comprise SAC405. SAC405 comprises 95.5% Sn, 4.0% Ag and 0.5% Cu.

Figure 11:
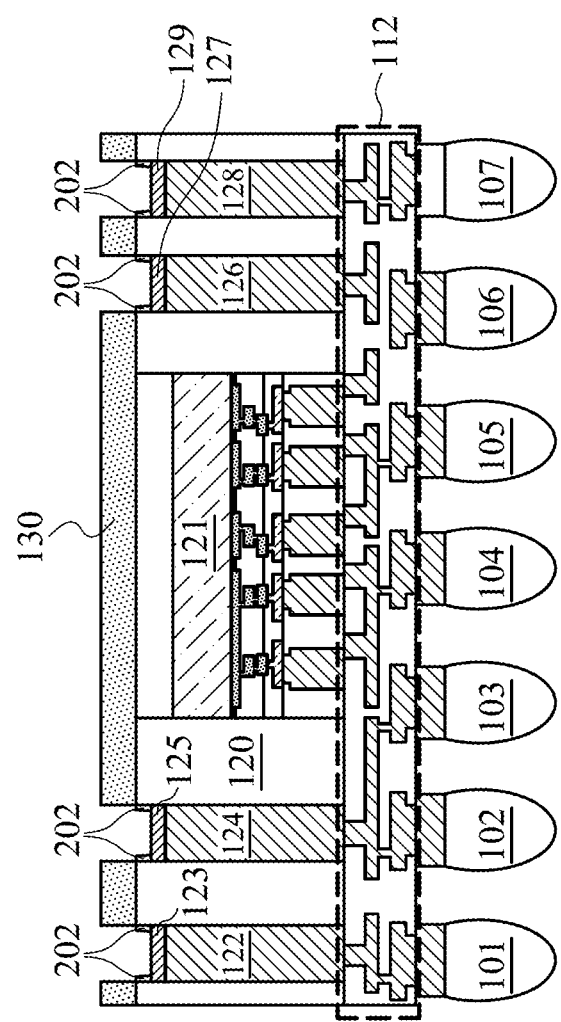
FIG. 11 illustrates a cross sectional view of the semiconductor device shown in FIG. 10 after a patterning process is applied to the surface of the dielectric layer in accordance with various embodiments of the present disclosure.

FIG. 11 illustrates a cross sectional view of the semiconductor device shown in FIG. 10 after a patterning process is applied to the surface of the dielectric layer in accordance with various embodiments of the present disclosure. The patterning process may be implemented by using suitable patterning techniques such as an etching process, a laser ablation process and/or the like. According to the shape and location of the solder layers 123, 125, 127 and 129, an etching process or a laser beam (not shown) may be applied to the top surface of the dielectric layer 130 until the top surfaces of the solder layers 123, 125, 127 and 129 are exposed. After the etching or laser ablation process finishes, portions of the seed layer 202 remain as shown in FIG. 11. There is a shallow trench over each solder layer. The remaining seed layer 202 is on the sidewall of the shallow trench. One advantageous feature of having the remaining seed layer 202 is that the remaining seed layer 202 helps to create a reliable joint structure, which will be described below with respect to FIG. 12.

Figure 12:
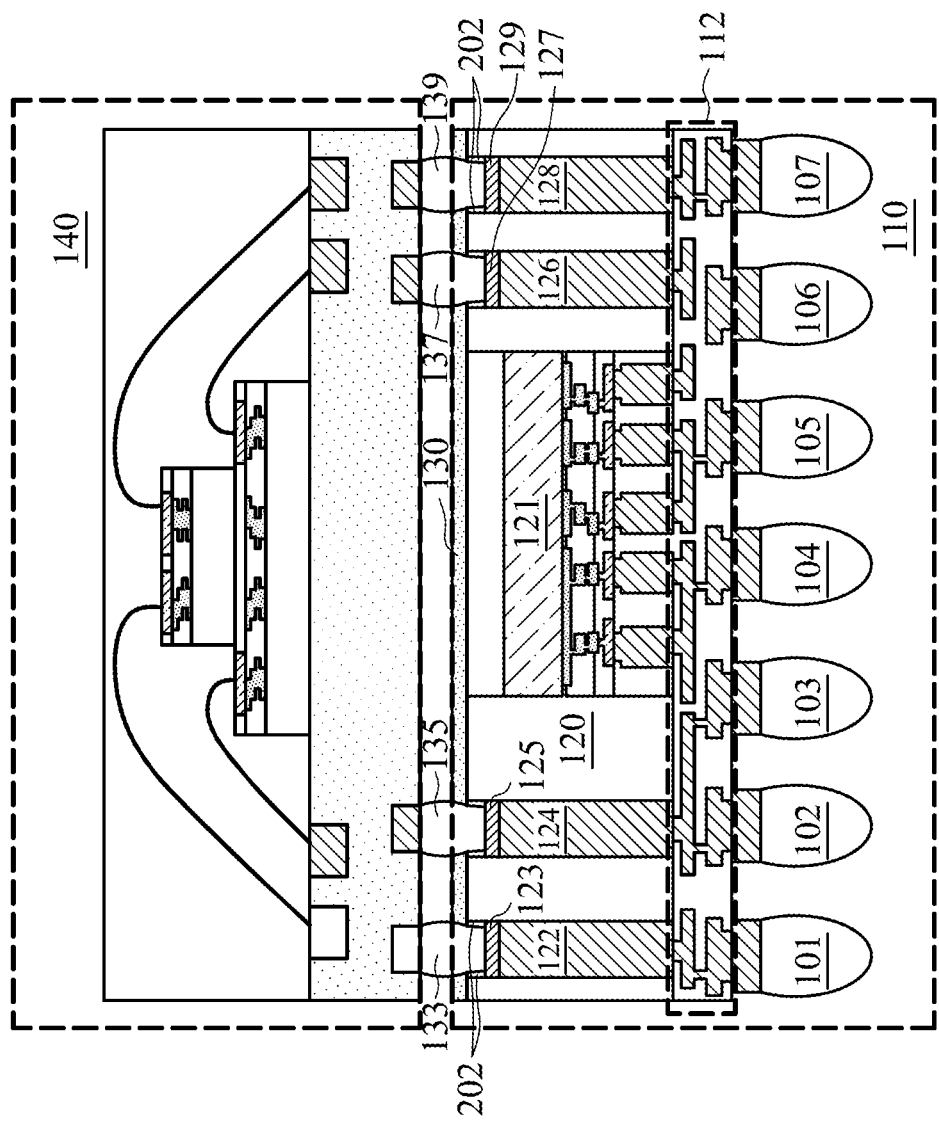
FIG. 12 illustrates a cross sectional view of the semiconductor device shown in FIG. 11 before a top package is mounted on the bottom package in accordance with various embodiments of the present disclosure.

FIG. 12 illustrates a cross sectional view of the semiconductor device shown in FIG. 11 before a top package is mounted on the bottom package in accordance with various embodiments of the present disclosure. The top package 140 may comprise a plurality of stacked dies, which may be wire bonded to the input and output terminals of the top package 140. The stacked dies of the top package 140 may comprise memory dies, logic dies, processor dies and/or the like.

It should be noted while FIG. 12 illustrates two stacked dies in the top package 140, this is merely an example. Likewise, the use of wire bonding is merely illustrative and other approaches for electrically connecting the stacked dies are within the contemplated scope of the present disclosure.

The top package 140 may be bonded on the bottom package 110 through a reflow process. The bonding process comprises placing the bumps 133, 135, 137 and 139 of the top package 140 against the respective solder layers 123, 125, 127 and 129 on the bottom package 110. A reflow process is then performed to melt solder layers 123, 125, 127 and 129, thereby forming a joint structure between the top package 140 and the bottom package 110 and electrically connecting the bumps to the solder layers. It should be noted the remaining seed layer 202 helps to create a reliable joint structure between the solder layers (e.g., solder layer 123) and their respective bumps (e.g., bump 133). In particular, before the reflow process, there is a shallow trench over each solder layer. The remaining seed layer 202 forms a conductive layer to cover the sidewall of the shallow trench. Such a conductive layer on the sidewall helps the bumps (e.g., bump 133) and the solder layers (e.g., solder layer 123) form a reliable joint structure.

Figure 13:
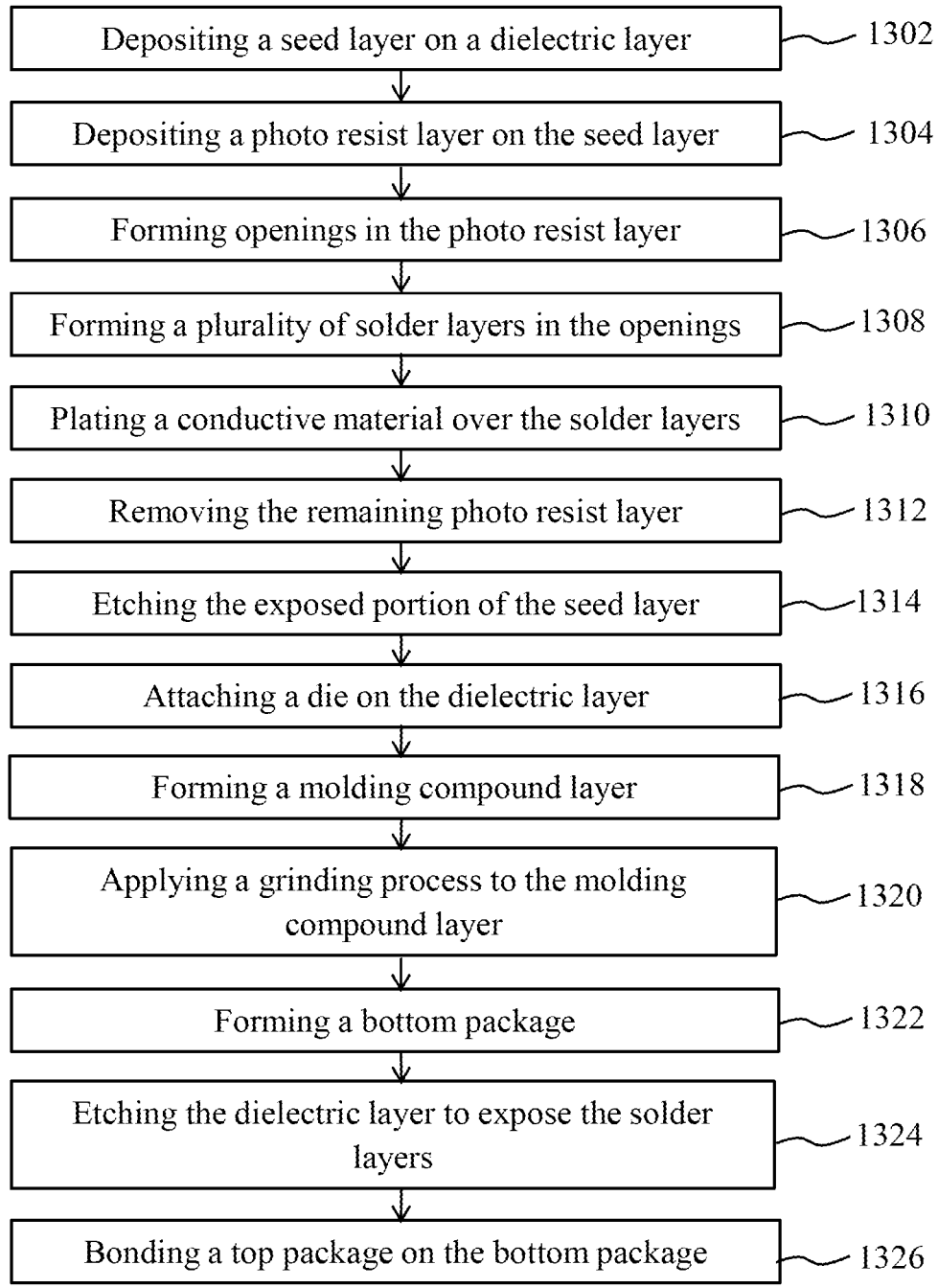
FIG. 13 illustrates a flow chart of a method for forming the semiconductor device shown in FIG. 1 in accordance with various embodiments of the present disclosure.

FIG. 13 illustrates a flow chart of a method for forming the semiconductor device shown in FIG. 1 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 13 may added, removed, replaced, rearranged and repeated.

At step 1302, a seed layer is deposited on a dielectric layer through suitable semiconductor deposition processes. At step 1304, a photoresist layer is deposited over the seed layer. At step 1306, a patterning process is applied to the photoresist layer. As a result, a plurality of openings may be formed in the photoresist layer. At step 1308, a solder layer is formed in each opening. More particularly, the solder layer is located in the bottom of each opening. The solder layer has a thickness in a range from 30 um to 50 um.

At step 1310, through a plating process, a conductive material is filled in the openings to form a plurality of through vias embedded in the photoresist layer. At step 1312, the remaining photoresist layer is removed through a suitable photoresist stripping process. At step 1314, once the photoresist layer is removed, the exposed portion of the seed layer is etched away through a suitable etching process.

At step 1316, a semiconductor die is attached to the dielectric layer. In particular, the substrate side of the semiconductor die is boned on the dielectric layer. At step 1318, a molding compound layer is formed over the dielectric layer. The through vias and the semiconductor die are embedded in the molding compound layer.

At step 1320, a grinding process is applied to the molding compound layer until the top surface of the semiconductor die is exposed. At step 1322, a bottom package is formed by forming a plurality of interconnect structures over the molding compound layer, forming UBM structures over the interconnect structures and forming a plurality of bumps over their respective UBM structures.

At step 1324, according to the location of the solder layers, an etching process is applied to the dielectric layer until the top surfaces of the solder layers are exposed. At step 1326, a top package is picked and placed on the bottom package. The bumps of the top package and the solder layers of the bottom package form a joint structure through a suitable reflow process.

Figure 14:
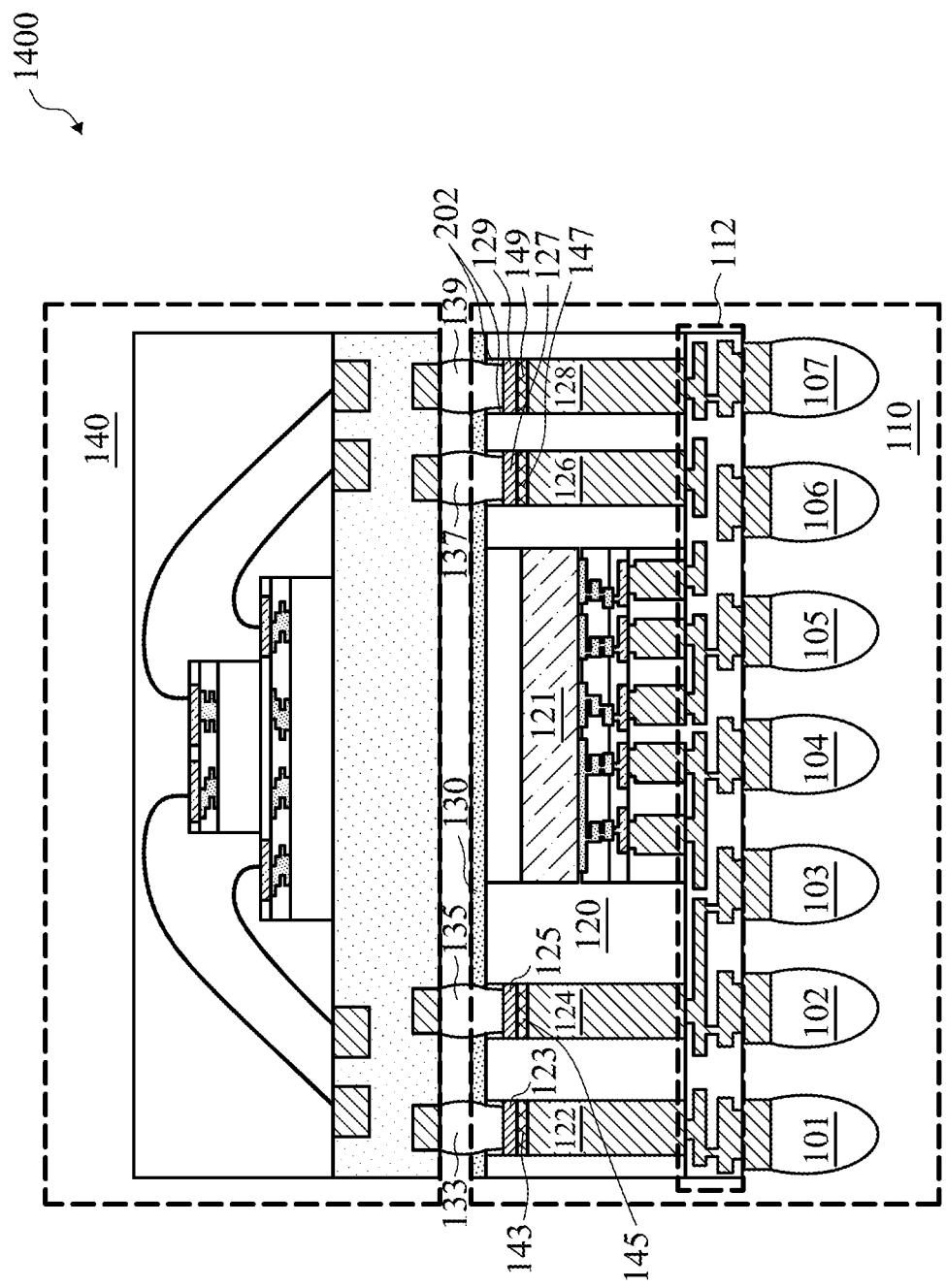
FIG. 14 illustrates a cross sectional view of yet another package-on-package semiconductor device in accordance with various embodiments of the present disclosure.

FIG. 14 illustrates a cross sectional view of yet another package-on-package semiconductor device in accordance with various embodiments of the present disclosure. The package-on-package semiconductor device 1400 is similar to the package-on-package semiconductor device 100 shown in FIG. 1 except that there is a nickel layer formed between a solder layer and its corresponding through via.

As shown in FIG. 14, a first nickel layer 143 is formed between the solder layer 123 and the through via 122. Likewise, a second nickel layer 145 is formed between the solder layer 125 and the through via 124. A third nickel layer 147 is formed between the solder layer 127 and the through via 126. A fourth nickel layer 149 is formed between the solder layer 129 and the through via 128.

In some embodiments, the nickel layers 143, 145, 147 and 149 have a thickness in a range from about 0.5 um to about 2 um. The nickel layers 143, 145, 147 and 149 are formed on their respective solder layers through suitable deposition processes. One advantageous feature of having the nickel layers 143, 145, 147 and 149 is the nickel layers help to prevent the intermetallic compound (IMC) formation between Sn of the solder layers and copper of the through vias.

Figure 15:
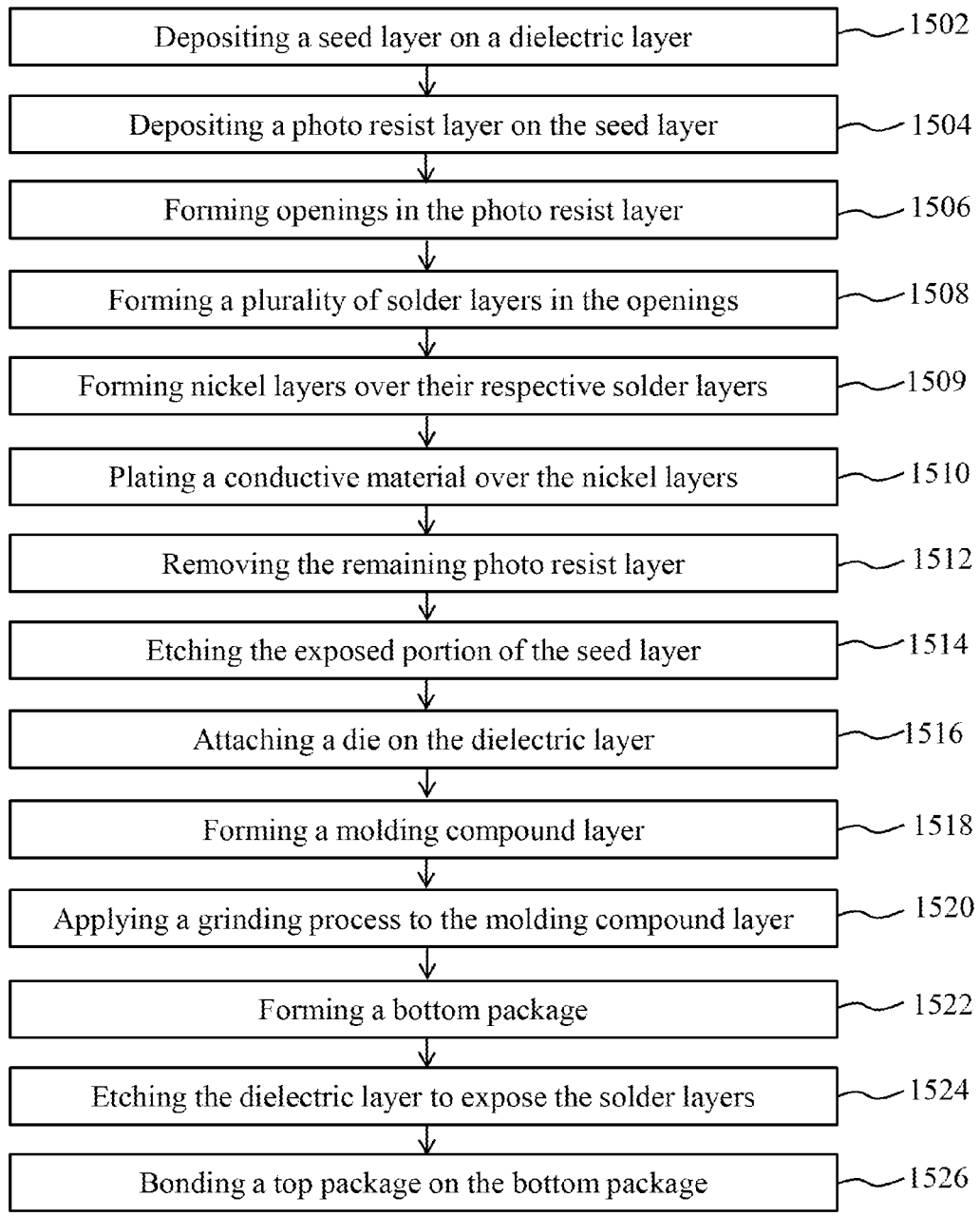
FIG. 15 illustrates a flow chart of a method for forming the semiconductor device shown in FIG. 14 in accordance with various embodiments of the present disclosure.

FIG. 15 illustrates a flow chart of a method for forming the semiconductor device shown in FIG. 14 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 15 may added, removed, replaced, rearranged and repeated.

The fabrication steps 1502-1508 and 1510-1526 are similar to steps 1302-1326 shown in FIG. 13, and hence are not discussed in detail herein again to avoid unnecessary repetition. At step 1509, after the solder layers are formed, nickel layers are formed over their respective solder layers through suitable semiconductor deposition techniques such as electroplating, non-electroplating, CVD and/or the like.

In accordance with an embodiment, a device comprises a bottom package comprising a molding compound layer on a first side of an interconnect layer, a through via in the molding compound layer and a solder layer on a top surface of the through via and a top package bonded over the bottom package, wherein the top package comprises at a first bump, and wherein the first bump and the solder layer form a joint structure between the top package and the bottom package.

In accordance with an embodiment, a device comprises a bottom package comprising an interconnect structure, a molding compound layer over the interconnect structure, a dielectric layer on the molding compound layer, a semiconductor die in the molding compound layer and a solder layer embedded in the molding compound layer, wherein a top surface of the solder layer is lower than a top surface of the molding compound layer and a top package bonded on the bottom package through a joint structure formed by the solder layer and a bump of the top package.

In accordance with an embodiment, a method depositing a seed layer on a dielectric layer, patterning a photoresist layer over the seed layer to form an opening, forming a solder layer in the opening, forming a conductive layer over the solder layer through a plating process, attaching a semiconductor die on the dielectric layer, forming a molding compound layer over the dielectric layer to form a bottom package, wherein the semiconductor die, the conductive layer and the solder layer are embedded in the molding compound layer.

The method further comprises applying a grinding process to the molding compound layer until a surface of the semiconductor die is exposed, applying a dielectric removal process to the dielectric layer until a surface of the solder layer is exposed and mounting a top package on the bottom package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a seed layer on a dielectric layer;
   patterning a photoresist layer over the seed layer to form an opening;
   forming a solder layer in the opening;
   forming a conductive layer over the solder layer through a plating process;
   attaching a semiconductor die on the dielectric layer;
   forming a molding compound layer over the dielectric layer to form a bottom package, wherein the semiconductor die, the conductive layer and the solder layer are embedded in the molding compound layer;
   applying a grinding process to the molding compound layer until a surface of the semiconductor die is exposed;
   applying a dielectric removal process to the dielectric layer until a surface of the solder layer is exposed; and
   mounting a top package on the bottom package.

2. The method of claim 1, further comprising:
   prior to the step of attaching the semiconductor die on the dielectric layer, removing the photoresist layer.

3. The method of claim 1, wherein:
   the top package comprises a bump and the bump of the top package and the solder layer form a joint structure during the step of mounting the top package on the bottom package, and wherein a lower portion of the joint structure is surrounded by the seed layer.

4. The method of claim 1, further comprising:
   prior to the step of forming the conductive layer over the solder layer through the plating process, depositing a nickel layer on the solder layer.

5. The method of claim 4, wherein:
   the nickel layer has a thickness in a range from about 0.5 µm to about 2 µm.

6. A method comprising:
   depositing a seed layer on a dielectric layer;
   patterning a photoresist layer over the seed layer to form an opening;
   forming a solder layer in the opening;
   forming a nickel layer on and in contact with the solder layer;
   plating a conductive material over the nickel layer;
   removing remaining portions of the photoresist layer;
   attaching a semiconductor die on the dielectric layer;
   forming a molding compound layer over the dielectric layer to form a bottom package;
   applying a grinding process to the molding compound layer until a surface of the semiconductor die is exposed;
   removing a portion of the dielectric layer to expose a surface of the solder layer; and
   mounting a top package on the bottom package.

7. The method of claim 6, further comprising:
   prior to the step of attaching the semiconductor die on the dielectric layer, etching exposed portions of the seed layer.

8. The method of claim 6, wherein:
   the semiconductor die is embedded in the molding compound layer after the step of forming the molding compound layer over the dielectric layer.

9. The method of claim 6, further comprising:
forming an interconnect structure over the molding compound layer.

10. The method of claim 9, wherein:
the interconnect structure comprises a metal line and a redistribution layer.

11. The method of claim 9, wherein:
the interconnect structure is on and in contact with the molding compound layer; and
the interconnect structure is electrically coupled to the semiconductor die.

12. The method of claim 9, further comprising:
forming a plurality of bumps over the interconnect structure, wherein the plurality of bumps are electrically connected to the semiconductor die through the interconnect structure.

13. The method of claim 6, further comprising:
placing a bump of the top package against the nickel layer and the solder layer; and
applying a reflow process to the top package and the bottom package to form a joint structure.

14. The method of claim 6, further comprising:
forming the nickel layer through a deposition process.

15. The method of claim 14, wherein:
the nickel layer is of a thickness in a range from about 0.5 μm to about 2 μm.

16. A method comprising:
depositing a seed layer on a dielectric layer;
patterning a photoresist layer over the seed layer to form a first opening and a second opening;
forming a first solder layer in the first opening and a second solder layer in the second opening;
plating a conductive material in the first opening and the second opening to form a first via and a second via;
attaching a semiconductor die on the dielectric layer;
forming a molding compound layer over the dielectric layer to form a bottom package, wherein the semiconductor die, the first via and the second via are embedded in the molding compound layer;
applying a grinding process to the molding compound layer until a surface of the semiconductor die is exposed;
removing portions of the dielectric layer to expose the first solder layer and the second solder layer; and
mounting a top package on the bottom package, wherein bumps of the top package, the first solder layer and the second solder layer form a joint structure.

17. The method of claim 16, further comprising:
forming a first nickel layer on the first solder layer; and
forming a second nickel layer on the second solder layer.

18. The method of claim 17, wherein:
the first nickel layer is between and in contact with the first solder layer and the first via; and
the second nickel layer is between and in contact with the second solder layer and the second via.

19. The method of claim 16, further comprising:
prior to the step of attaching the semiconductor die on the dielectric layer, removing remaining portions of the photoresist layer.

20. The method of claim 16, wherein:
the semiconductor die is between the first via and the second via.

* * * * *